(12) United States Patent
Lee et al.

(10) Patent No.: US 11,256,138 B2
(45) Date of Patent: Feb. 22, 2022

(54) WHITE LIGHT EMITTING DIODE WITH FILTERING LAYER AND BACKLIGHT MODULE AND DISPLAY DEVICE COMPRISING THE SAME

(71) Applicants: Chung-Hwa Lee, New Taipei (TW); Jian-Ging Chen, Kaohsiung (TW)

(72) Inventors: Chung-Hwa Lee, New Taipei (TW); Jian-Ging Chen, Kaohsiung (TW)

( * ) Notice: Subject to any disclaimer, the term of this patent is extended or adjusted under 35 U.S.C. 154(b) by 0 days.

(21) Appl. No.: 16/903,409

(22) Filed: Jun. 17, 2020

(65) Prior Publication Data

US 2020/0393725 A1 Dec. 17, 2020

(30) Foreign Application Priority Data

Jun. 17, 2019 (TW) ................................. 108120880

(51) Int. Cl.
| | |
|---|---|
| *G02F 1/13357* | (2006.01) |
| *F21V 9/30* | (2018.01) |
| *F21V 9/40* | (2018.01) |
| *F21V 9/35* | (2018.01) |
| *F21V 9/32* | (2018.01) |
| *G02F 1/1335* | (2006.01) |

(52) U.S. Cl.
CPC .......... *G02F 1/133609* (2013.01); *F21V 9/30* (2018.02); *F21V 9/32* (2018.02); *F21V 9/35* (2018.02); *F21V 9/40* (2018.02); *G02F 1/133605* (2013.01); *G02F 1/133614* (2021.01)

(58) Field of Classification Search
CPC ........ F21V 9/35; F21V 9/40; G02F 1/133609; G02F 2001/133614
See application file for complete search history.

(56) References Cited

U.S. PATENT DOCUMENTS

| | | | |
|---|---|---|---|
| 2004/0104391 A1* | 6/2004 | Maeda | C09K 11/025 257/79 |
| 2017/0005238 A1* | 1/2017 | Hung | H01L 24/19 |
| 2018/0023771 A1* | 1/2018 | Kim | G02F 1/133611 362/84 |
| 2018/0097158 A1* | 4/2018 | Estrada | C09K 5/06 |
| 2019/0219834 A1* | 7/2019 | Ace | G02C 7/104 |
| 2019/0384108 A1* | 12/2019 | Hai | G02F 1/133621 |
| 2020/0013931 A1* | 1/2020 | Hong | H01L 33/50 |

* cited by examiner

*Primary Examiner* — Keith G. Delahoussaye
(74) *Attorney, Agent, or Firm* — Bacon & Thomas, PLLC

(57) ABSTRACT

A white light emitting diode includes: a light emitting diode chip including a first surface and a second surface opposite to the first surface; an electrode disposed on the first surface of the light emitting diode; a phosphor layer disposed on the second surface of the light emitting diode; and a filtering layer disposed on the phosphor layer, wherein the filtering layer is a dual-band notch filtering layer or a triple-mode bandpass filtering layer. In addition, a backlight module and a display device using the aforementioned white light emitting diode are also disclosed.

15 Claims, 12 Drawing Sheets

WHITE LIGHT EMITTING DIODE WITH FILTERING LAYER AND BACKLIGHT MODULE AND DISPLAY DEVICE COMPRISING THE SAME

CROSS REFERENCE TO RELATED APPLICATION

This application claims the benefits of the Taiwan Patent Application Serial Number 108120880, filed on Jun. 17, 2019, the subject matter of which is incorporated herein by reference.

BACKGROUND

1. Field

The present disclosure relates to a white light emitting diode and a backlight module and a display device comprising the same. More specifically, the present disclosure relates to a white light emitting diode with improved color gamut and a backlight module and a display device comprising the same.

2. Description of Related Art

White light emitting diodes can be applied to various fields, and for example, can be applied to light sources or backlight modules of display devices. However, compared to the light emitting from quantum dots, the light emitting from the phosphors comprises the light with undesired wavelengths. Thus, the color gamut of the white light emitting diodes prepared with the phosphors is not ideal. Currently, some manufactures prepare white light emitting diodes with quantum dots as the materials of the light emitting layers to improve the backlight effect of the backlight module used in the display device.

However, the manufacturing cost of the quantum dots is high. If the color gamut of the white light emitting diode can be improved by effectively removing the light with the undesired wavelengths, the backlight effect of the backlight module in the display device may further be improved even though the quantum dots are not used as the material of the light emitting layer in the white light emitting diode.

Therefore, it is desirable to develop a novel white light emitting diode using phosphors, which can be used in the backlight module of the display device.

SUMMARY

The present disclosure provides a white light emitting diode, which includes a light filtering layer to improve the color gamut of the white light emitting layer.

The white light emitting diode of the present disclosure comprises: a light emitting diode chip comprising a first surface and a second surface opposite to the first surface; an electrode disposed on the first surface of the light emitting diode chip; a phosphor layer disposed on the second surface of the light emitting diode chip; and a light filtering layer disposed on the phosphor layer, wherein the light filtering layer is a dual-band notch filtering layer or a triple-mode bandpass filtering layer.

In the white light emitting diode of the present disclosure, the light emitting from the phosphor layer can be further filtered by using the light filtering layer, especially by using a dual-band notch filtering layer or a triple-mode bandpass filtering layer. More specifically, the light with undesired wavelengths can be further removed by using the light filtering layer in the white light emitting diode of the present disclosure. Thus, when the white light emitting diode of the present disclosure is applied to the backlight module of the display device, the backlight with wide color gamut can be provided, and the display quality of the display device can further be improved.

In the white light emitting diode of the present disclosure, the light emitting diode chip further comprises a side surface connecting to the first surface and the second surface, and the phosphor layer is further disposed on the side surface. More specifically, in one embodiment of the present disclosure, except for the first surface, all the surfaces of the light emitting diode chip are disposed with the phosphor layer.

In the white light emitting diode of the present disclosure, the light filtering layer may be further disposed on a surface of the phosphor layer corresponding to the side surface. In one embodiment of the present disclosure, the light filtering layer can be disposed only on a surface of the phosphor layer corresponding to the second surface of the light emitting diode chip. In another embodiment of the present disclosure, the light filtering layer can be disposed on surfaces of the phosphor layer corresponding to the second surface and the side surfaces of the light emitting diode chip.

The white light emitting diode of the present disclosure may further comprise a protection layer disposed between the phosphor layer and the light filtering layer. In addition, the protection layer may further be disposed on surfaces of the phosphor layer corresponding to the second surface and the side surface. Thus, in one embodiment of the present disclosure, all the surfaces of the phosphor layer can be disposed with the protection layer.

In the white light emitting diode of the present disclosure, the light emitting diode chip can be a blue light emitting diode chip. Preferably, the light emitting diode chip is a flip-chip blue light emitting diode chip. In one embodiment of the present disclosure, the light emitting diode chip may comprise two electrodes, and these two electrodes are disposed on the first surface of the light emitting diode chip. Herein, a material of the electrode may comprise, but is not limited to, Cu, Al, Mo, W, Au, Cr, Ni, Pt, Ti, Cu alloy, Al alloy, Mo alloy, W alloy, Au alloy, Cr alloy, Ni alloy, Pt alloy, Ti alloy, or other suitable metal or metal alloy.

In the white light emitting diode of the present disclosure, the phosphor layer is a layer comprising plural phosphors. The types of the phosphor layer is not particularly limited, and can be selected according to the type of the light emitting diode chip or the desired color of the light emitting from the phosphors. For example, the phosphors can be phosphors capable of emitting yellow light after excitation; and when these phosphors are used with the blue light emitting diode chip, the light emitting diode of the present disclosure can emit white light.

In the present disclosure, examples of the phosphors may comprise, but are not limited to, ZnO, $ZrO_2$, PbO, $Y_2O_3$, $Y_2O_2$, $Zn_2SiO_4$, $Y_3Al_5O_{12}$, $Y_3(AlGa)_5O_{12}Y_2SiO_5$, LaOCl, $InBO_3$, $ZnGa_2O_4$, ZnS, PbS, CdS, CaS, SrS, $Zn_xCd_{1-x}S$, $Y_2O_2S$, SiAlON ($Si_{6-z}Al_zO_zN_{8-z}$), AlN or $Gd_2O_2S$. In addition, the compound for forming the phosphors may further be doped with at least one atom selected from the group consisting of Cu, Ag, Eu, Yb, La, Cl, Tb, Al, Ce, Er, Zn, Mn and other lanthanides (such as Pr, Pm, Sm, Ho, or Er). However, the present disclosure is not limited thereto.

In the present disclosure, the particle size of the phosphors can be ranged from 10 nm to 50 μm, but the present disclosure is not limited thereto.

In the white light emitting diode of the present disclosure, a material of the protection layer may comprise, but is not limited to, $SiO_2$, $Al_2O_3$, ZnO, ZrO, $Y_2O_3$, $TiO_2$, CoO, $MnO_2$, NiO, CuO, PbO, $Si_3N_4$ or a combination thereof.

In one embodiment of the present disclosure, the light filtering layer of the white light emitting diode can be a light filtering plate, which can be adhered on the phosphor layer, especially on the protection layer on the phosphor layer, via a transparent adhesive. In another embodiment of the present disclosure, the light filtering layer can be a light filtering film, which can be coated on the phosphor layer, especially on the protection layer on the phosphor layer.

In addition, the present disclosure further provides a backlight module, which comprises: a reflecting film; an optical film disposed on the reflecting film; and the aforesaid white light emitting diode disposed between the reflecting film and the optical film. Furthermore, the present disclosure further provides a display device, which comprises: the aforesaid backlight module; and a display panel disposed on the backlight module.

In the present disclosure, the backlight module can be a direct-light type backlight module or an edge-light type backlight module.

In the present disclosure, the display panel can be a display panel requiring a backlight source. For example, the display panel can be a liquid crystal display panel.

In the backlight module and the display device of the present disclosure, the color gamut of the backlight module can be improved. Thus, even though the phosphor layer is used as the light emitting layer in the white light emitting diode of the present disclosure, the backlight effect of the white light emitting diode can be similar to the backlight effect of the light emitting diode using quantum dots in the light emitting layer.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

In addition, the features in different embodiments of the present disclosure can be mixed to form another embodiment.

Embodiment 1

FIG. 1A to FIG. 1D are cross-sectional views showing a process for manufacturing a white light emitting diode according to the present embodiment.

Figure 1A:
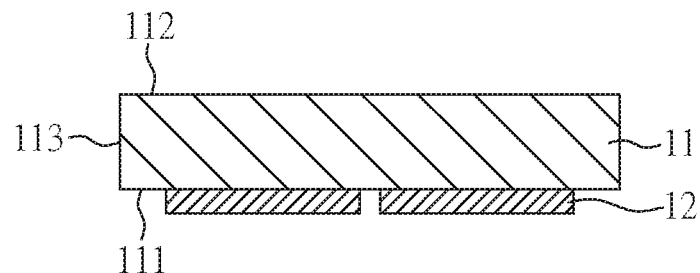
FIG. 1A to FIG. 1D are cross-sectional views showing a process for manufacturing a white light emitting diode according to Embodiment 1 of the present disclosure.

As shown in FIG. 1A, a light emitting diode chip 11 is provided, which comprises a first surface 111 and a second surface 112 opposite to the first surface 111. Two electrodes 12 (respectively an anode and a cathode) are disposed on the first surface 111 of the light emitting diode chip 11. In addition, the light emitting diode chip 11 further comprises side surfaces 113 connecting to the first surface 111 and the second surface 112. In the present embodiment, the light emitting diode chip 11 is a flip-chip blue light emitting diode chip.

Figure 1B:
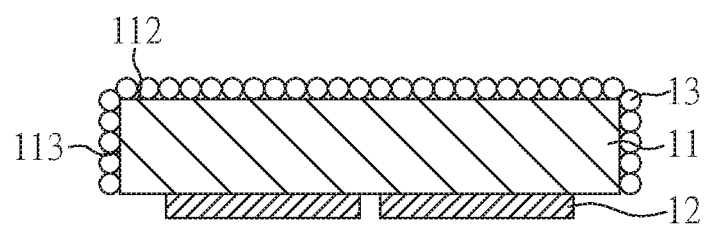

As shown in FIG. 1B, a phosphor layer 13 is formed on the second surface 112 and the side surfaces 113 of the light emitting diode chip 11. In the present embodiment, the method for forming the phosphor layer 13 is not particularly limited, and can be formed by the method disclosed in Taiwan Patent Number I398306.

Figure 1C:
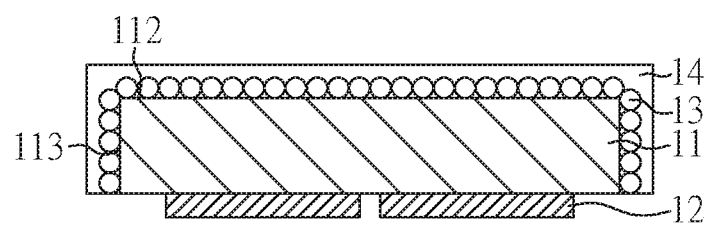

As shown in FIG. 1C, a protection layer 14 is formed on the phosphor layer 13. In the present embodiment, the protection layer 14 can be an optical protection layer. In addition, the method for forming the protection layer 14 is not particularly limited, and the protection layer 14 can be formed by any coating process known in the art. For example, the protection layer 14 can be formed by spin coating, blade coating, inkjet coating, printing, roll coating, spray coating, etc.

Figure 1D:
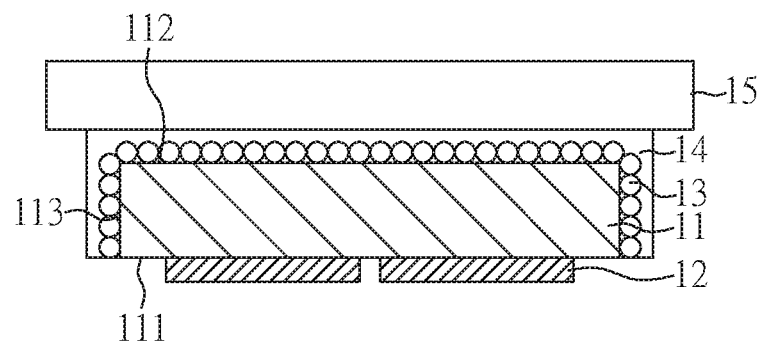

As shown in FIG. 1D, a light filtering layer 15 is disposed on the protection layer 14. The light filtering layer 15 can be adhered onto the protection layer 14 via a transparent adhesive. In the present embodiment, the light filtering layer 15 can be a dual-band notch filtering plate or a triple-mode bandpass filtering plate. Finally, after a heating process, the light filtering layer 15 can be fixed onto the phosphor layer 13 to obtain the white light emitting diode of the present embodiment.

After the aforesaid process, the white light emitting diode of the present embodiment can be obtained. As shown in FIG. 1D, the white light emitting diode of the present embodiment comprises: a light emitting diode chip 11 comprising a first surface 111 and a second surface 112 opposite to the first surface 111; two electrodes 12 disposed on the first surface 111 of the light emitting diode chip 11; a phosphor layer 13 disposed on the second surface 112 of the light emitting diode chip 11; and a light filtering layer 15 disposed on the phosphor layer 13, wherein the light filtering layer 15 is a dual-band notch filtering plate or a triple-mode bandpass filtering plate.

In the present embodiment, the light emitting diode chip 11 further comprises side surfaces 113 connecting to the first surface 111 and the second surface 112, and the phosphor layer 13 is further disposed on the side surfaces 113. More specifically, in the present embodiment, except for the first surface 111 of the light emitting diode chip 11, the phosphor layer 13 is disposed on all the other surfaces (including the second surface 112 and the side surfaces 113) of the light emitting diode chip 11.

In the present embodiment, the white light emitting diode further comprises a protection layer 14 disposed on surfaces of the phosphor layer 13 corresponding to the second surface 112 and side surfaces 113. More specifically, in the present embodiment, the phosphor layer 13 is formed on the second surface 112 and the side surfaces 113 of the light emitting diode chip 11 and the protection layer 14 is used for protecting the phosphor layer 13, so the protection layer 14 is formed on the surface of the phosphor layer 13 corresponding to the second surface 112 and the side surfaces 113.

In the present embodiment, the light filtering layer 15 is disposed on the protection layer 14, so the protection layer 14 is disposed between the phosphor layer 13 and the light filtering layer 15. In addition, in the present embodiment, the light filtering layer 15 is a dual-band notch filtering layer or a triple-mode bandpass filtering layer, which is directly adhered on the surface of the protection layer 14 corresponding to the second surface 112 via an adhesion layer. Hence, the light emitting from the phosphor layer 13 can pass through the protection layer 14 and achieve the light filtering layer 15, and the light with undesired wavelengths can be further filtered out by the light filtering layer 15.

Embodiment 2

Figure 2:
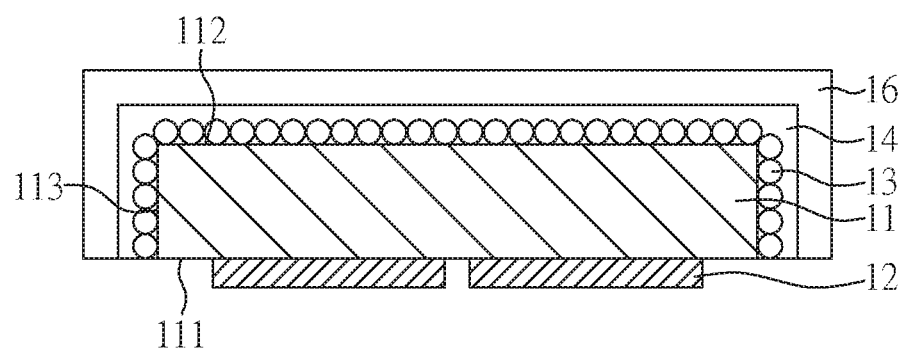
FIG. 2 is a cross-sectional view of a white light emitting diode according to Embodiment 2 of the present disclosure.

FIG. 2 is a cross-sectional view of a white light emitting diode according to the present embodiment. The preparing method and the structure of the white light emitting diode of the present embodiment are similar to those shown in Embodiment 1, except for the following differences.

In the present embodiment, the light filtering layer is formed on the protection layer via a coating process. Hence, in the present embodiment, in order to obtain the light filtering layer uniformly coated on the protection layer 14, a leveling process is performed on the protection layer 14 after forming the structure shown in FIG. 1C. Herein, a coating process known in the art (for example, a vacuum coating process) can be used to form a coating (not shown in the figure) on the protection layer 14 to level the surface of the protection layer 14. In the present embodiment, a $Si_3N_4$ film can be formed on the protection layer 14 via a plasma-enhanced chemical vapor deposition (PECVD), and the $Si_3N_4$ film is formed on the surfaces of the protection layer 14 corresponding to the second surface 112 and the side surfaces 113.

Hereinafter, as shown in FIG. 2, a light filtering layer 16 is formed on the protection layer 14. Herein, the light filtering layer 16 can be directly formed on the protection layer 14 through a coating process known in the art (for example, a vacuum coating process). In the present embodiment, a dual-band notch filtering material or a triple-mode bandpass filtering material can be used to form the light filtering layer 16 on the protection layer 14 (especially, on the $Si_3N_4$ film on the protection layer 14) through a sputtering process.

Hence, in the present embodiment, the light filtering layer 16 is disposed on the protection layer 14, and the protection layer 14 is disposed between the phosphor layer 13 and the light filtering layer 16. In addition, in the present embodiment, the light filtering layer 16 is a dual-band notch filtering film or a triple-mode bandpass filtering film, which is directly formed on the surfaces of the protection layer 14 corresponding to the second surface 112 and the side surfaces 113. Hence, the light emitting from the phosphor layer 13 can pass through the protection layer 14 and achieve the light filtering layer 16, and the light with undesired wavelengths can be further filtered out by the light filtering layer 16.

Embodiment 3

Figure 3:
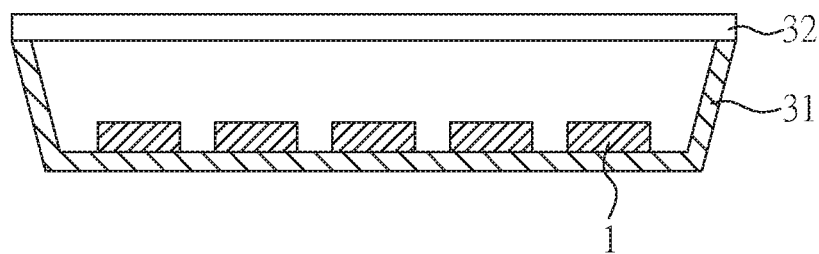
FIG. 3 is a cross-sectional view of a direct-light type backlight module according to Embodiment 3 of the present disclosure.

FIG. 3 is a cross-sectional view of a direct-light type backlight module according to the present embodiment. As shown in FIG. 3, the backlight module of the present embodiment comprises: a reflecting film 31; an optical film 32 disposed on the reflecting film 31; and a white light emitting diode 1 disposed between the reflecting film 31 and the optical film 32. In the present embodiment, the white light emitting diode 1 can be the white light emitting diode shown in Embodiment 1 or Embodiment 2.

In the present embodiment, the reflecting film 31 may be used as a house for the backlight module. In addition, even not shown in the figure, the optical film 32 may comprise conventional films used in the backlight module, for example, a diffusion film, a prism sheet or a brightness enhancement film. However, the present disclosure is not limited thereto, and the constitution of the optical film 32 can be adjusted according to the need.

Embodiment 4

Figure 4:
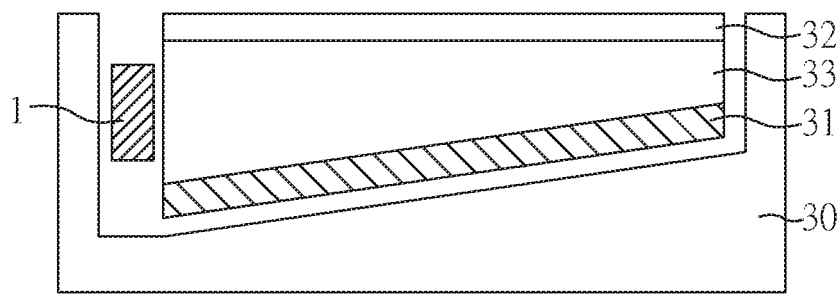
FIG. 4 is a cross-sectional view of an edge-light type backlight module according to Embodiment 4 of the present disclosure.

FIG. 4 is a cross-sectional view of an edge-light type backlight module of the present embodiment. The backlight module of the present embodiment is similar to that shown in Embodiment 3, except for the following differences.

As shown in FIG. 4, the backlight module of the present embodiment further comprises a light guide plate 33 disposed between the reflecting film 31 and the optical film 32, and the white light emitting diode 1 is disposed at one side of the light guide plate 33. In addition, the backlight module of the present embodiment further comprises a house 30, and the reflecting film 31, the optical film 32, the light guide plate 33 and the white light emitting diode 1 are disposed in the containing space of the house 30.

Embodiment 5

Figure 5:
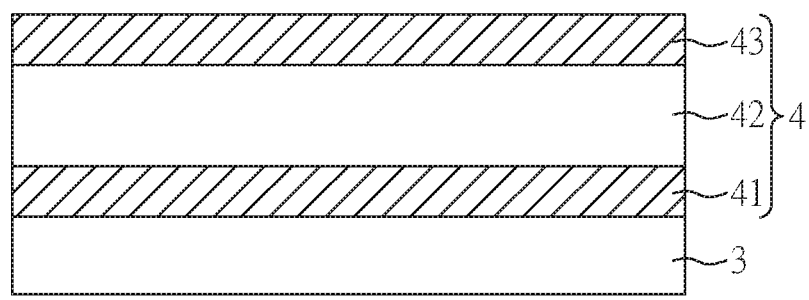
FIG. 5 is a cross-sectional view of a display device according to Embodiment 5 of the present disclosure.

FIG. 5 is a cross-sectional view of a display device of the present embodiment. As shown in FIG. 5, the display device of the present embodiment comprises: a backlight module 3; and a display panel 4 disposed on the backlight module 3. The backlight module 3 can be the backlight module shown in Embodiment 3 or Embodiment 4. In addition, the display panel 4 may comprise: a first substrate 41; a second substrate 43 opposite to the first substrate 41; and a display layer 42 disposed between the first substrate 41 and the second substrate 43. In the present embodiment, the display layer 42 is a liquid crystal layer.

In one aspect of the present embodiment, the first substrate 41 can be a thin film transistor substrate with thin film transistors (not shown in the figure) formed thereon, and the second substrate 43 can be a color filter substrate with a color filter layer (not shown in the figure) or a black matrix layer (not shown in the figure) formed thereon. In another aspect of the present embodiment, the color filter layer (not shown in the figure) may be disposed on the first substrate 41, and the first substrate 41 is a color filter on array (COA) substrate. In further aspect of the present embodiment, the black matrix layer (not shown in the figure) may be disposed on the first substrate 41, and the first substrate 41 is a black matrix on array (BOA) substrate.

Test Example 1

Figure 6:
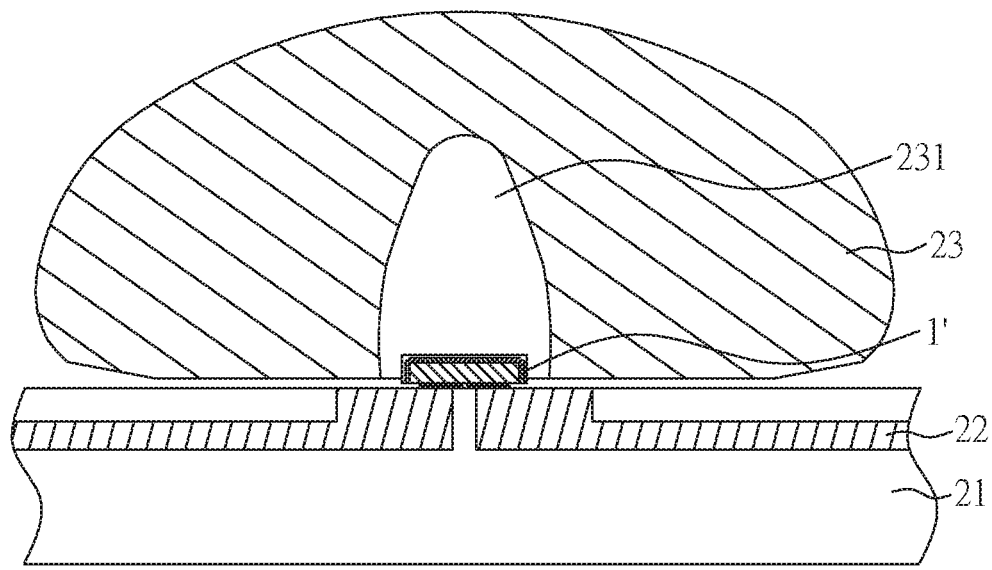
FIG. 6 is a cross-sectional view of a testing unit using in a comparative example according to Test example 1 of the present disclosure.
Figure 7:
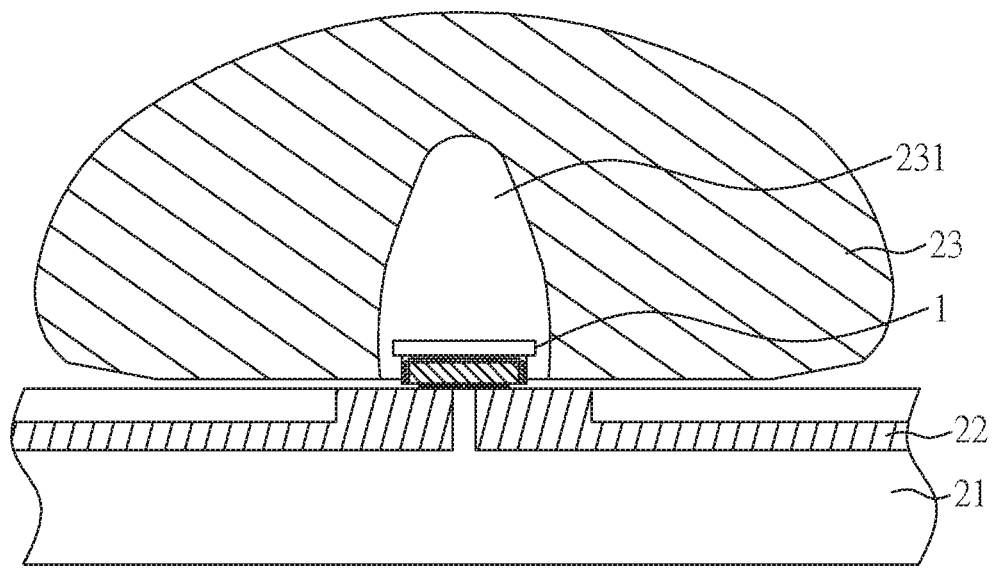
FIG. 7 is a cross-sectional view of a testing unit using in an experimental example according to Test example 1 of the present disclosure.

FIG. 6 and FIG. 7 are respectively a cross-sectional view of a testing unit using in a comparative example and an experimental example in the present test example. As shown in FIG. 6, the testing unit used in the comparative example of the present test example comprises: a print circuit board 21 with a circuit 22 formed thereon; a white light emitting diode 1' shown in FIG. 1C, wherein the electrodes 12 (as shown in FIG. 1C) electrically connects to the circuit 22; and a diffusion lens 23 disposed on the print circuit board 21, wherein the white light emitting diode 1' shown in FIG. 1C is disposed in the cavity 231 of the diffusion lens 23. As shown in FIG. 7, the testing unit used in the experimental example of the present example is similar to the test unit used in the comparative example, except that the white light emitting diode 1' shown in FIG. 6 which has the structure shown in FIG. 1C used in the comparative example is replaced by the white light emitting diode 1 shown in FIG. 1D in the experimental example.

Then, the tests units shown in FIG. 6 and FIG. 7 are used in the backlight module shown in FIG. 3, and applied to the display device shown in FIG. 5, wherein the first substrate 41 is a thin film transistor substrate and the second substrate 43 is a color filter substrate.

In the present test example, the phosphors used in the white light emitting diode 1' and the white light emitting diode 1 are narrow-band red-emitting fluoride phosphors (KSF). In addition, the light filtering layer 15 (as shown in FIG. 1D) of the white light emitting diode 1 is a dual-band notch filtering plate. Furthermore, the spectra obtained in the comparative example and the experimental example are detected by the LED integrating sphere, and the color gamut obtained in the comparative example and the experimental example are detected by the color analyzer.

Figure 8A:
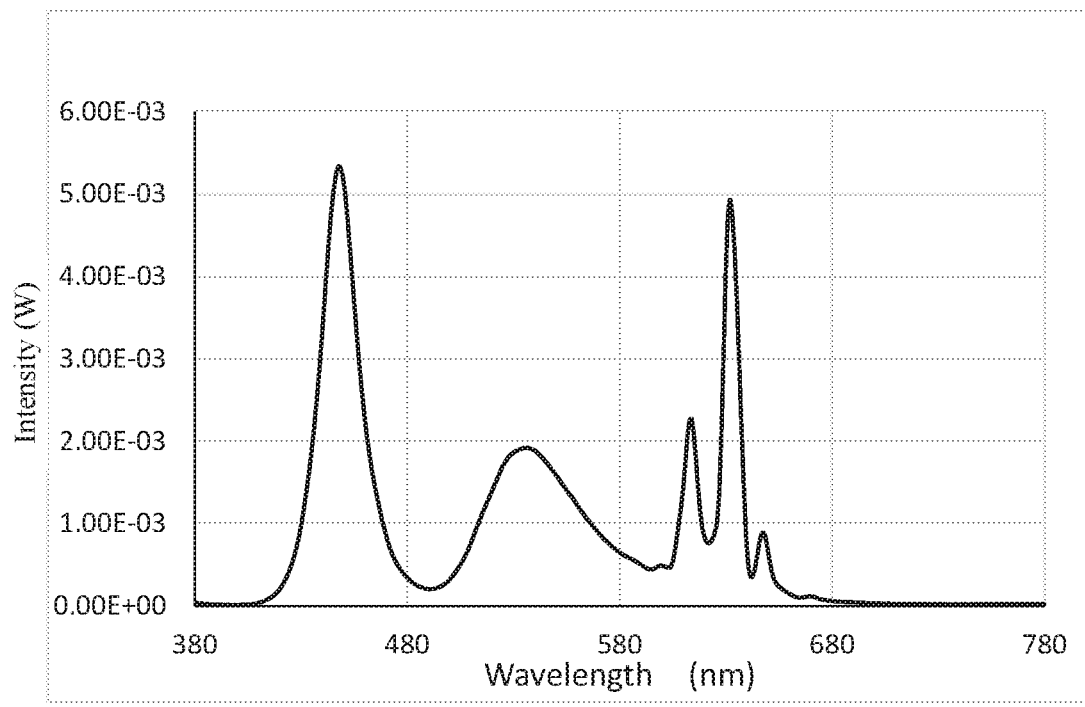
FIG. 8A and FIG. 8B are respectively a diagram showing a testing result of a comparative example and an experimental example according to Test example 1 of the present disclosure.
Figure 8B:
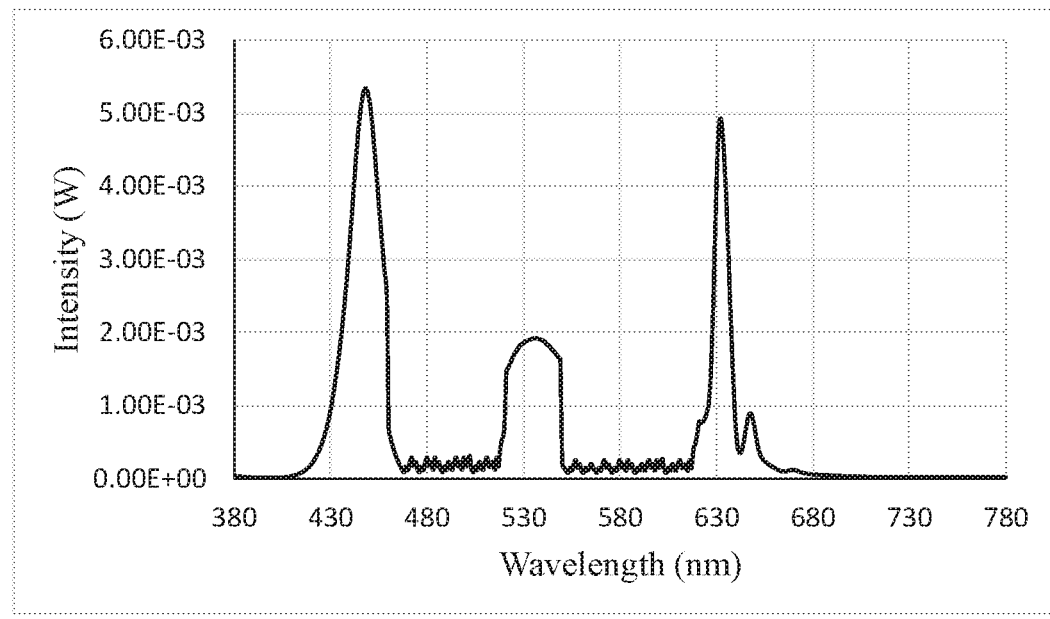

The spectra obtained in the comparative example and the experimental example are respectively shown in FIG. 8A and FIG. 8B. Compared to the white light emitting diode of the comparative example without using the dual-band notch filtering plate, the light with undesired wavelengths can be effectively filtered out when the dual-band notch filtering plate is used in the light emitting diode of the experimental example. Furthermore, 90.2% NTSC can be obtained by using the testing unit of the comparative example, but 113.1% NTSC can be obtained by using the testing unit of the experimental example.

Test Example 2

The test conditions of the present test example are similar to those of Test example 1, except that the fluoride red phosphors used in Test example 1 are replaced by nitroxide red phosphors in the present test example.

Figure 9A:
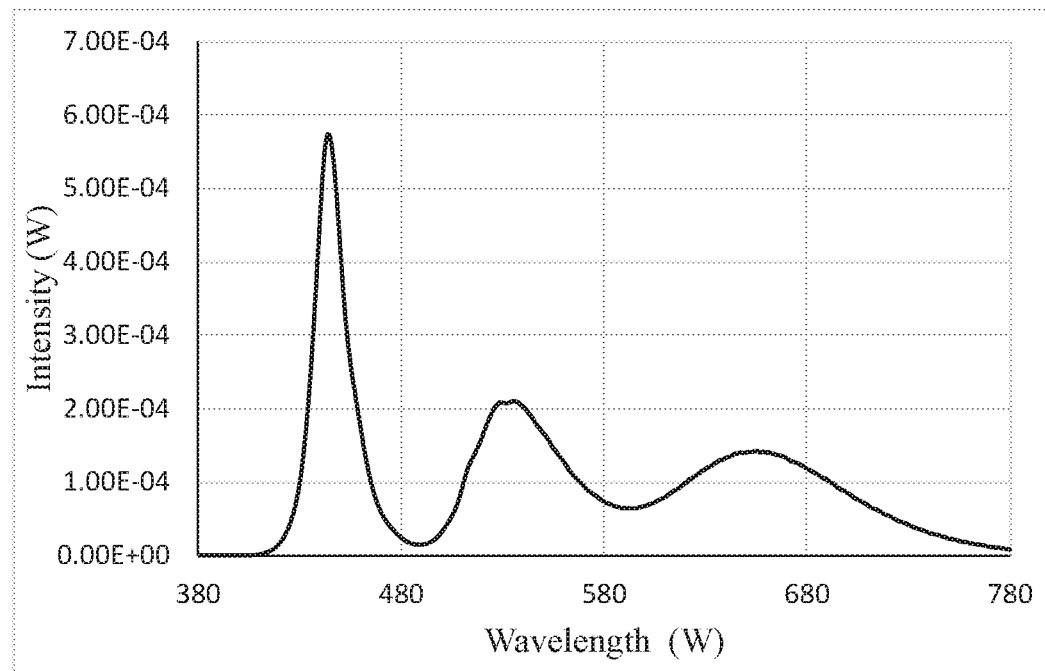
FIG. 9A and FIG. 9B are respectively a diagram showing a testing result of a comparative example and an experimental example according to Test example 2 of the present disclosure.
Figure 9B:
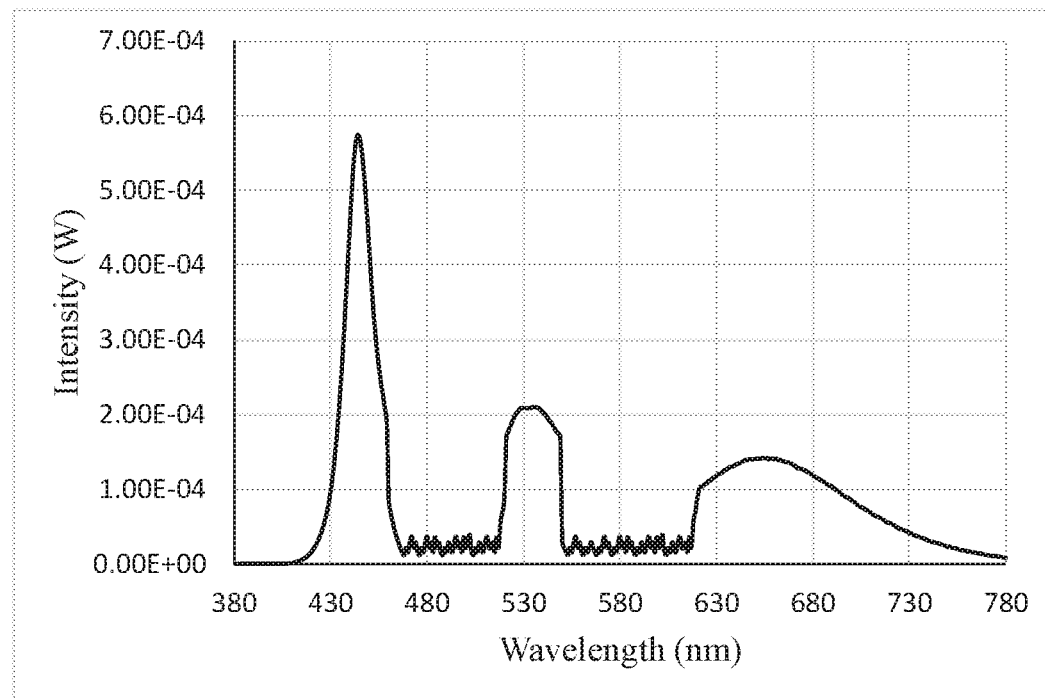

The spectra obtained in the comparative example and the experimental example are respectively shown in FIG. 9A and FIG. 9B. Compared to the white light emitting diode of the comparative example without using the dual-band notch filtering plate, the light with undesired wavelengths can be effectively filtered out when the dual-band notch filtering plate is used in the light emitting diode of the experimental example. Furthermore, 87.3% NTSC can be obtained by using the testing unit of the comparative example, but 109.9% NTSC can be obtained by using the testing unit of the experimental example.

Test Example 3

The test conditions of the present test example are similar to those of Test example 1, except that the white light emitting diode shown in FIG. 1D used in the experimental example in Test example 1 is replaced by the white light emitting diode shown in FIG. 2 in the experimental example of the present test example, and the light filtering layer 16 (as shown in FIG. 2) is a dual-band notch filtering film.

Figure 10A:
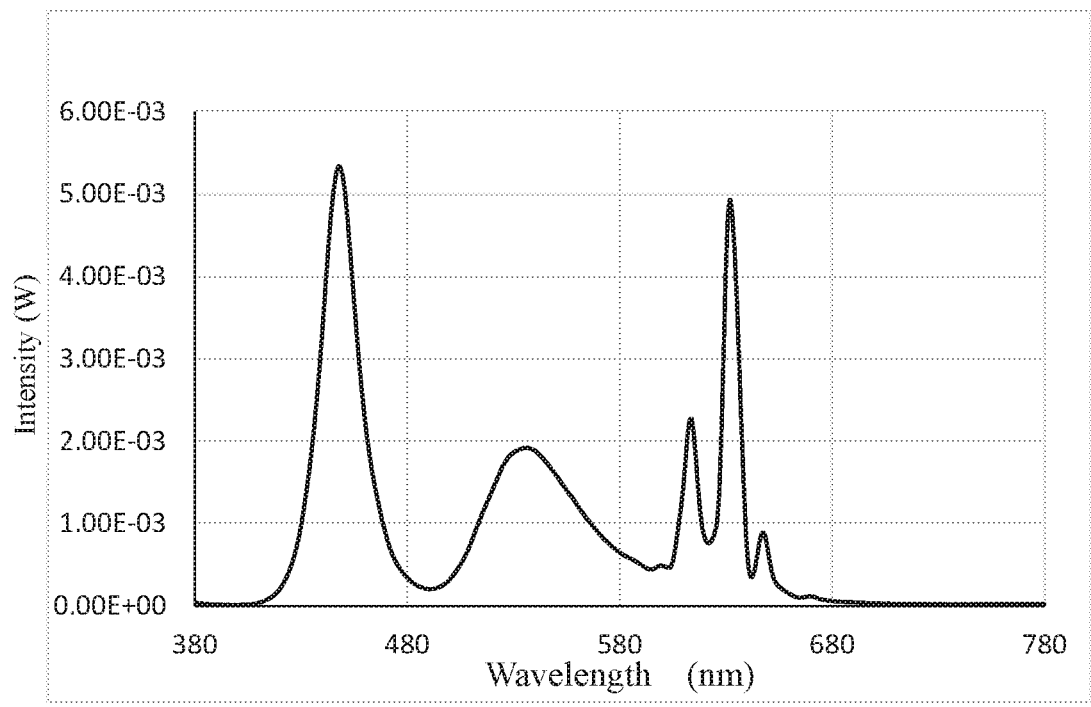
FIG. 10A and FIG. 10B are respectively a diagram showing a testing result of a comparative example and an experimental example according to Test example 3 of the present disclosure.
Figure 10B:
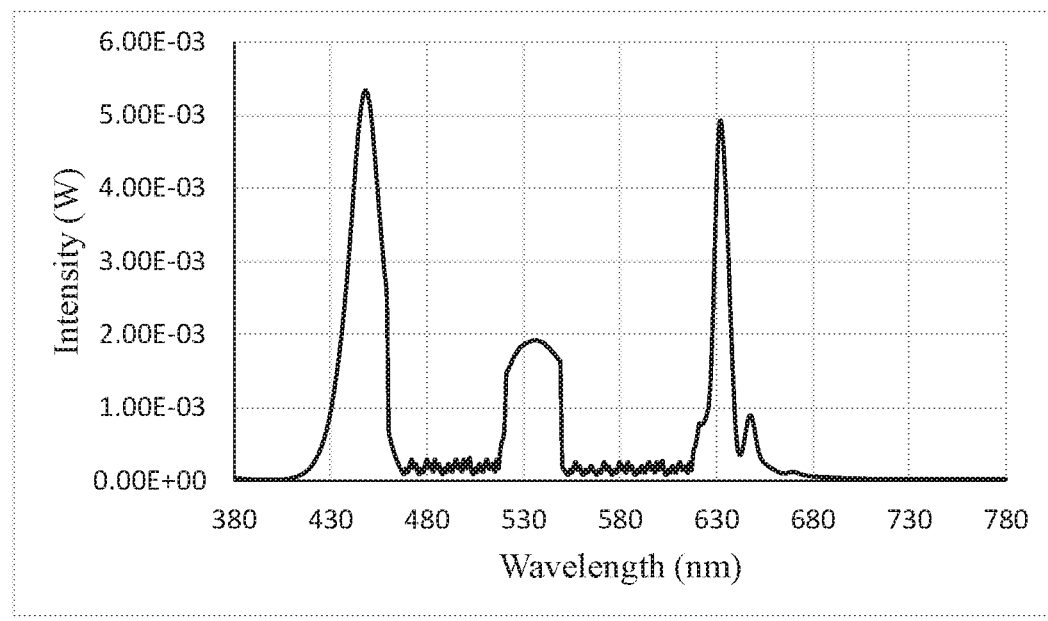

The spectra obtained in the comparative example and the experimental example are respectively shown in FIG. 10A and FIG. 10B. Compared to the white light emitting diode of the comparative example without using the dual-band notch filtering film, the light with undesired wavelengths can be effectively filtered out when the dual-band notch filtering film is used in the light emitting diode of the experimental example. Furthermore, 90.2% NTSC can be obtained by using the testing unit of the comparative example, but 113.1% NTSC can be obtained by using the testing unit of the experimental example.

Test Example 4

The test conditions of the present test example are similar to those of Test example 3, except that the fluoride red phosphors used in Test example 3 are replaced by nitroxide red phosphors in the present test example.

Figure 11A:
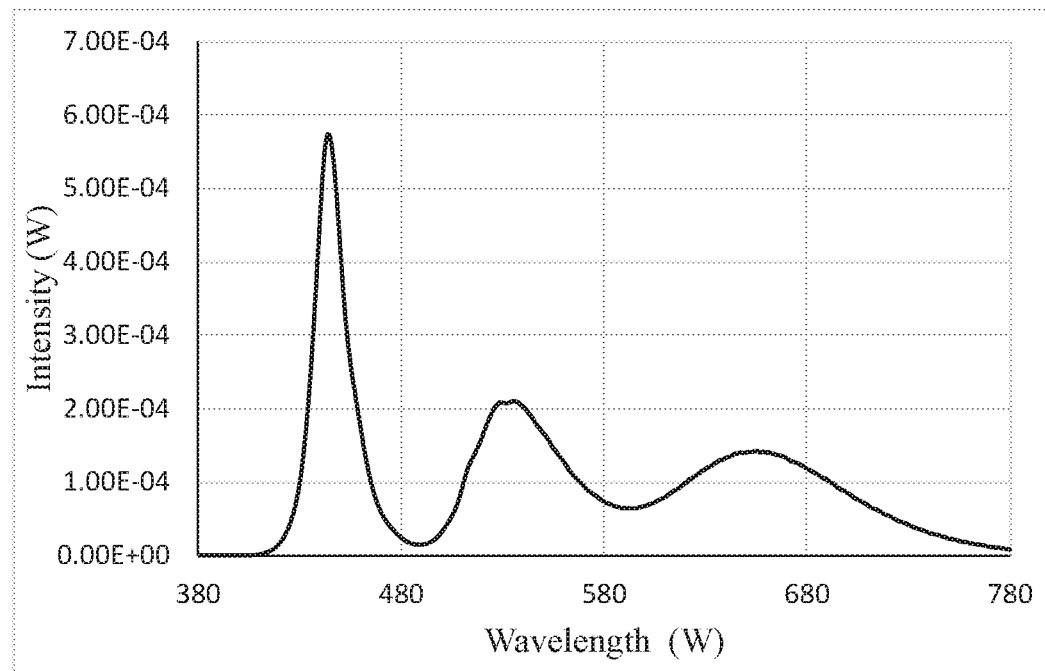
FIG. 11A and FIG. 11B are respectively a diagram showing a testing result of a comparative example and an experimental example according to Test example 4 of the present disclosure.
Figure 11B:
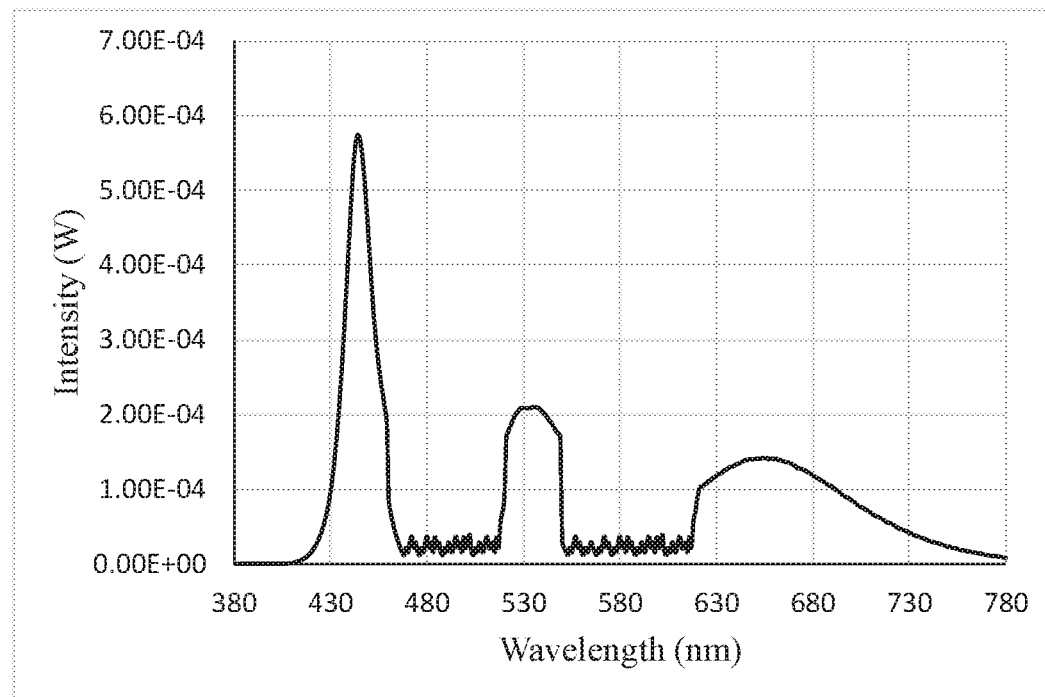

The spectra obtained in the comparative example and the experimental example are respectively shown in FIG. 11A and FIG. 11B. Compared to the white light emitting diode of the comparative example without using the dual-band notch filtering film, the light with undesired wavelengths can be effectively filtered out when the dual-band notch filtering film is used in the light emitting diode of the experimental example. Furthermore, 87.3% NTSC can be obtained by using the testing unit of the comparative example, but 109.9% NTSC can be obtained by using the testing unit of the experimental example.

Test Example 5

The test conditions of the present test example are similar to those of Test example 1, except that the light filtering layer 15 (as shown in FIG. 1D) is a triple-mode bandpass filtering plate.

Figure 12A:
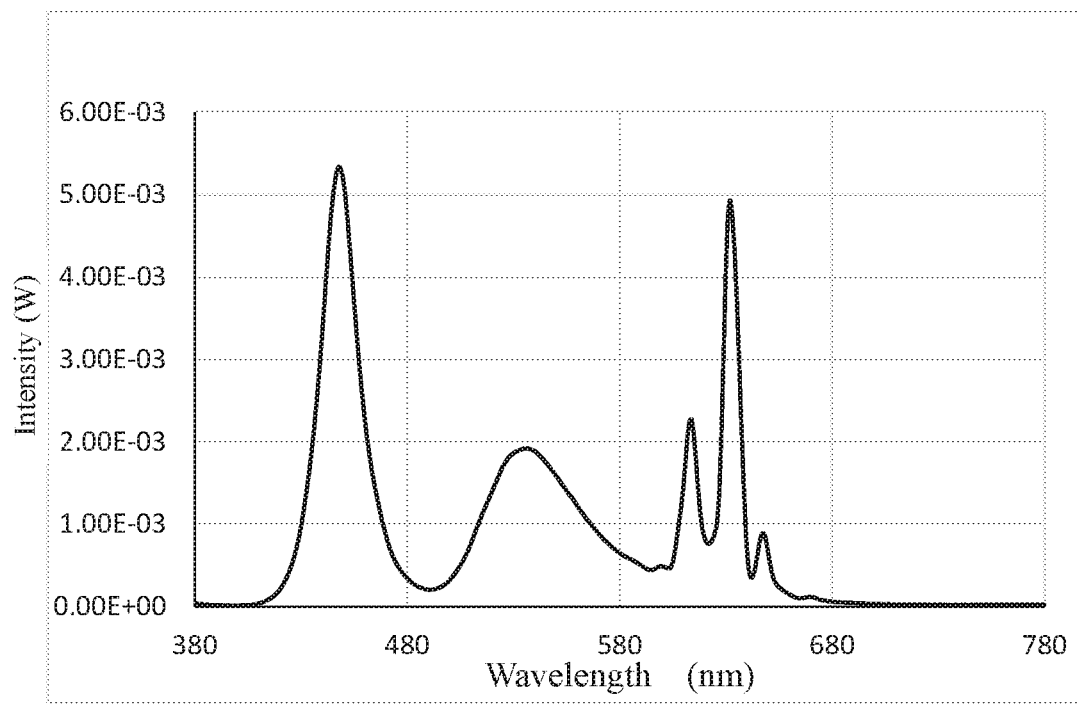
FIG. 12A and FIG. 12B are respectively a diagram showing a testing result of a comparative example and an experimental example according to Test example 5 of the present disclosure.
Figure 12B:
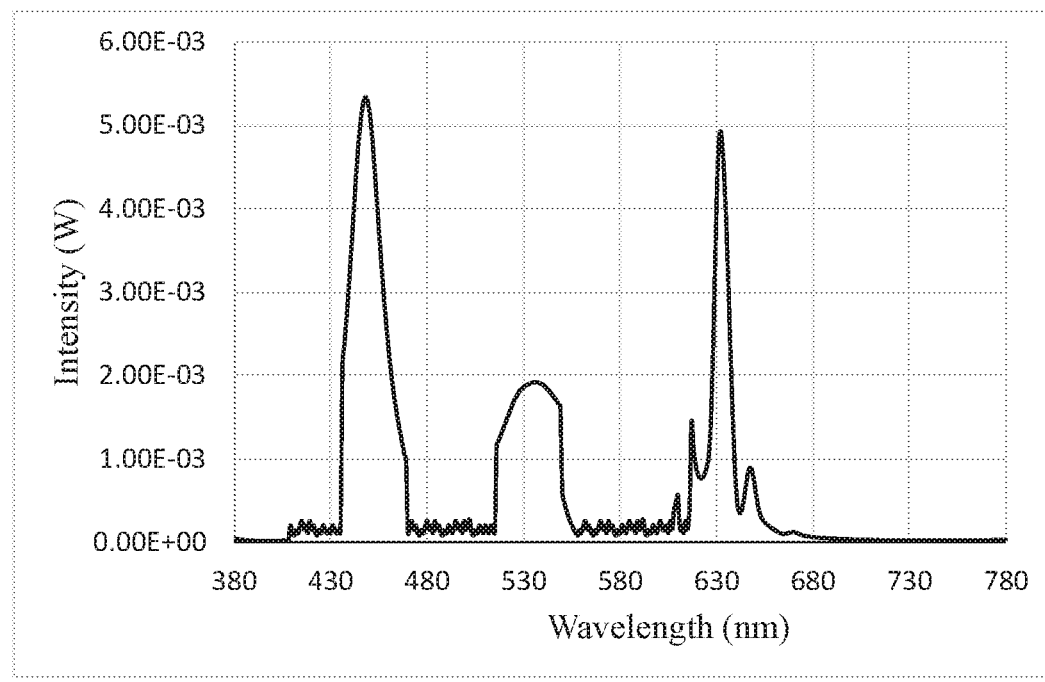

The spectra obtained in the comparative example and the experimental example are respectively shown in FIG. 12A and FIG. 12B. Compared to the white light emitting diode of the comparative example without using the triple-mode bandpass filtering plate, the light with undesired wavelengths can be effectively filtered out when the triple-mode bandpass filtering plate is used in the light emitting diode of the experimental example. Furthermore, 90.2% NTSC can be obtained by using the testing unit of the comparative example, but 103.1% NTSC can be obtained by using the testing unit of the experimental example.

Test Example 6

The test conditions of the present test example are similar to those of Test example 5, except that the fluoride red phosphors used in Test example 5 are replaced by nitroxide red phosphors in the present test example.

Figure 13A:
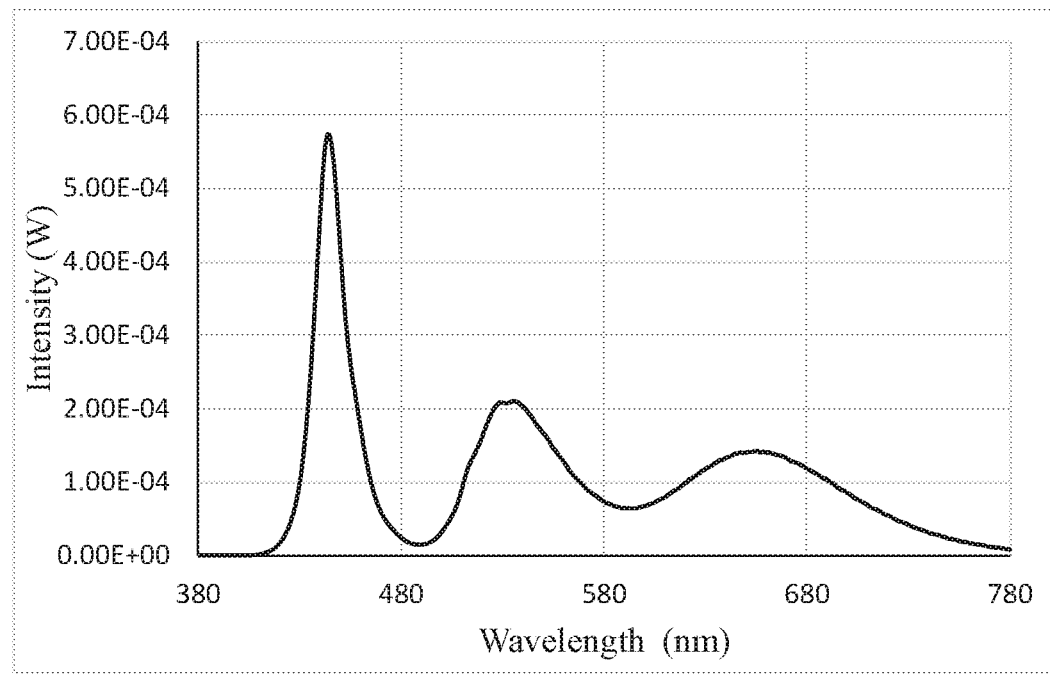
FIG. 13A and FIG. 13B are respectively a diagram showing a testing result of a comparative example and an experimental example according to Test example 6 of the present disclosure.
Figure 13B:
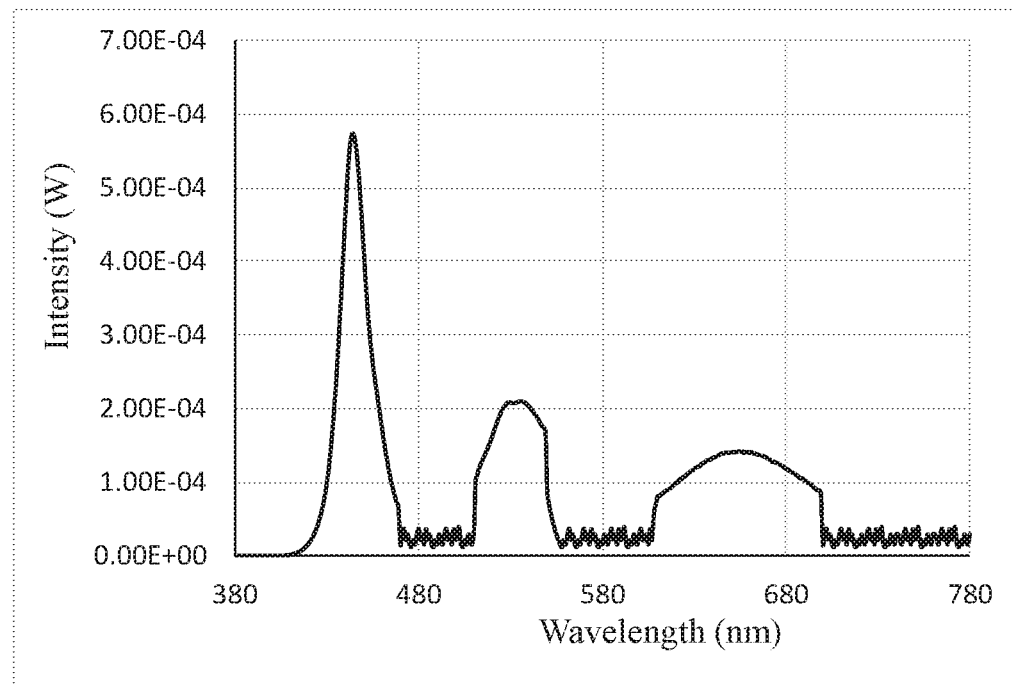

The spectra obtained in the comparative example and the experimental example are respectively shown in FIG. 13A and FIG. 13B. Compared to the white light emitting diode of the comparative example without using the triple-mode bandpass filtering plate, the light with undesired wavelengths can be effectively filtered out when the triple-mode bandpass filtering plate is used in the light emitting diode of the experimental example. Furthermore, 87.3% NTSC can be obtained by using the testing unit of the comparative example, but 102.9% NTSC can be obtained by using the testing unit of the experimental example.

Test Example 7

The test conditions of the present test example are similar to those of Test example 5, except that the white light emitting diode shown in FIG. 1D used in the experimental example in Test example 5 is replaced by the white light emitting diode shown in FIG. 2 in the experimental example of the present test example, and the light filtering layer 16 (as shown in FIG. 2) is a triple-mode bandpass filtering film.

Figure 14A:
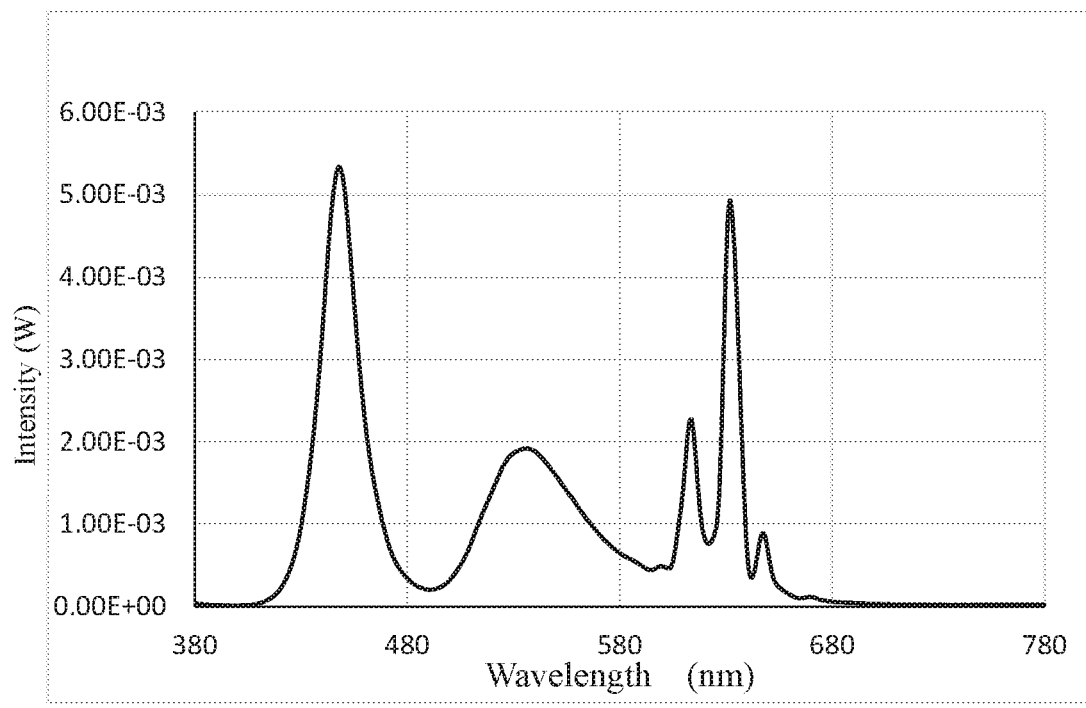
FIG. 14A and FIG. 14B are respectively a diagram showing a testing result of a comparative example and an experimental example according to Test example 7 of the present disclosure.
Figure 14B:
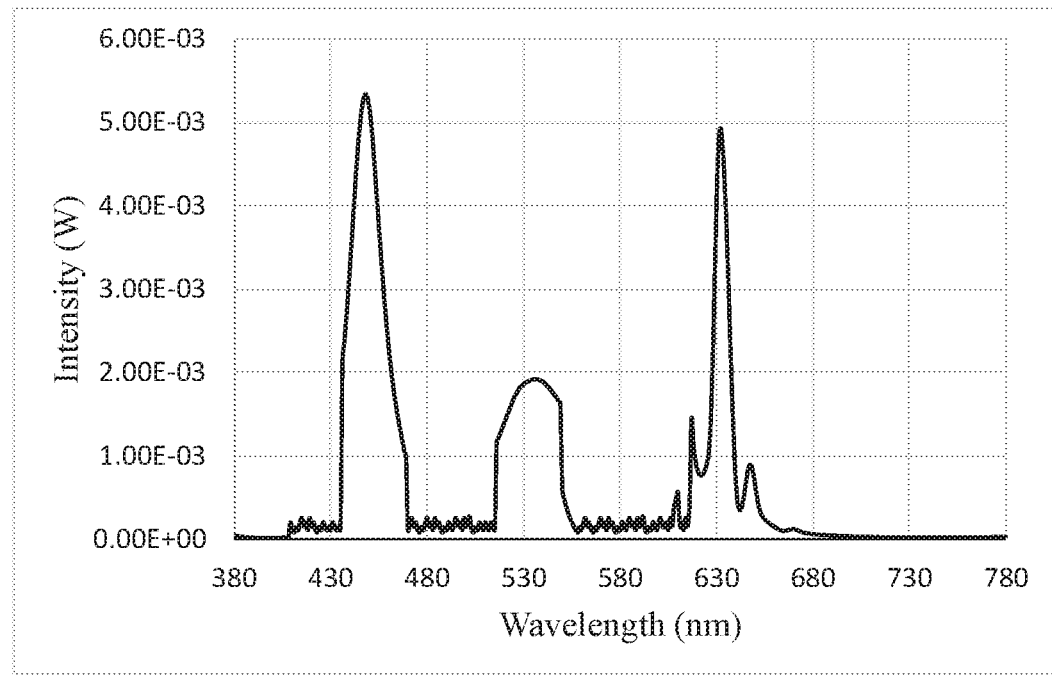

The spectra obtained in the comparative example and the experimental example are respectively shown in FIG. 14A and FIG. 14B. Compared to the white light emitting diode of the comparative example without using the triple-mode bandpass filtering film, the light with undesired wavelengths can be effectively filtered out when the triple-mode bandpass filtering film is used in the light emitting diode of the experimental example. Furthermore, 90.2% NTSC can be obtained by using the testing unit of the comparative example, but 103.1% NTSC can be obtained by using the testing unit of the experimental example.

Test Example 8

The test conditions of the present test example are similar to those of Test example 7, except that the fluoride red phosphors used in Test example 7 are replaced by nitroxide red phosphors in the present test example.

Figure 15A:
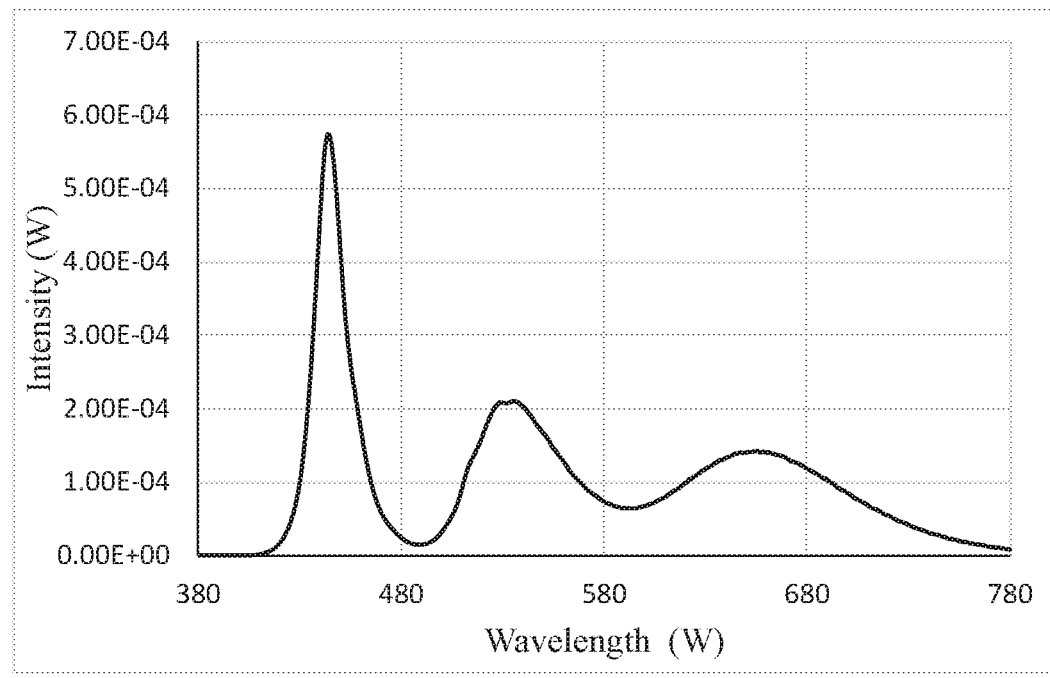
FIG. 15A and FIG. 15B are respectively a diagram showing a testing result of a comparative example and an experimental example according to Test example 8 of the present disclosure.
Figure 15B:
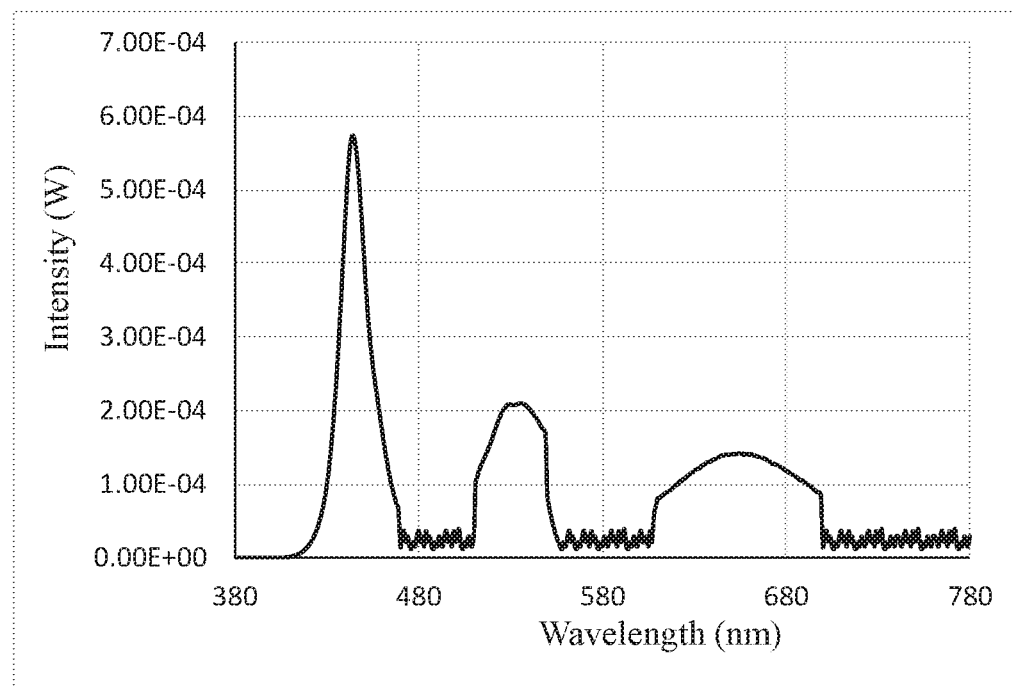

The spectra obtained in the comparative example and the experimental example are respectively shown in FIG. 15A and FIG. 15B.

Compared to the white light emitting diode of the comparative example without using the triple-mode bandpass filtering film, the light with undesired wavelengths can be effectively filtered out when the triple-mode bandpass filtering film is used in the light emitting diode of the experimental example. Furthermore, 87.3% NTSC can be obtained by using the testing unit of the comparative example, but 102.9% NTSC can be obtained by using the testing unit of the experimental example.

When the white light emitting diode comprise a dual-band notch filtering layer or a triple-mode bandpass filtering layer, this filtering layer can effectively filter out the light with undesired wavelengths, and the color gamut of the white light emitting diode can be effectively improved.

The white light emitting diode can be applied to a backlight module as a light source in any display device. The example of the display device may comprise, but is not limited to displays, mobile phones, laptops, video cameras, still cameras, music players, mobile navigators, or TV sets.

Although the present disclosure has been explained in relation to its embodiment, it is to be understood that many other possible modifications and variations can be made without departing from the spirit and scope of the disclosure as hereinafter claimed.

What is claimed is:

1. A white light emitting diode, comprising:
   a light emitting diode chip comprising a first surface and a second surface opposite to the first surface, wherein the first surface has a first region and a second region;
   two electrodes disposed on the first region of the first surface of the light emitting diode chip, and not disposed on the second region of the first surface of the light emitting diode chip;
   a phosphor layer having a plurality of phosphors, wherein the plurality of phosphors are directly disposed on the second surface of the light emitting diode chip;
   a protection layer disposed on the phosphor layer;
   a $Si_3N_4$ film disposed on the protection layer; and
   a light filtering layer disposed on the protection layer, wherein the light filtering layer is a dual-band notch filtering layer or a triple-mode bandpass filtering layer.

2. The white light emitting diode of claim 1, wherein the light emitting diode chip further comprises a side surface connecting to the first surface and the second surface, and the phosphor layer is further disposed on the side surface.

3. The white light emitting diode of claim 2, wherein the light filtering layer is further disposed on a surface of the phosphor layer corresponding to the side surface.

4. The white light emitting diode of claim 2, wherein the protection layer is disposed on surfaces of the phosphor layer corresponding to the second surface and the side surface.

5. The white light emitting diode of claim 3, wherein the protection layer is disposed on surfaces of the phosphor layer corresponding to the second surface and the side surface.

6. A backlight module, comprising:
a reflecting film;
an optical film disposed on the reflecting film; and
a white light emitting diode disposed between the reflecting film and the optical film and comprising:
a light emitting diode chip comprising a first surface and a second surface opposite to the first surface, wherein the first surface has a first region and a second region;
two electrodes disposed on the first region of the first surface of the light emitting diode chip, and not disposed on the second region of the first surface of the light emitting diode chip;
a phosphor layer having a plurality of phosphors, wherein the plurality of phosphors are directly disposed on the second surface of the light emitting diode chip;
a protection layer disposed on the phosphor layer;
a $Si_3N_4$ film disposed on the protection layer; and
a light filtering layer disposed on the protection layer, wherein the light filtering layer is a dual-band notch filtering layer or a triple-mode bandpass filtering layer.

7. The backlight module of claim 6, wherein the light emitting diode chip further comprises a side surface connecting to the first surface and the second surface, and the phosphor layer is further disposed on the side surface.

8. The backlight module of claim 7, wherein the light filtering layer is further disposed on a surface of the phosphor layer corresponding to the side surface.

9. The white light emitting diode of claim 7, wherein the protection layer is disposed on surfaces of the phosphor layer corresponding to the second surface and the side surface.

10. The white light emitting diode of claim 8, wherein the protection layer is disposed on surfaces of the phosphor layer corresponding to the second surface and the side surface.

11. A display device, comprising:
a backlight module; and
a display panel disposed on the backlight module;
wherein the backlight module comprises: a reflecting film;
an optical film disposed on the reflecting film; and a white light emitting diode disposed between the reflecting film and the optical film, wherein the white light emitting diode comprises:
a light emitting diode chip comprising a first surface and a second surface opposite to the first surface, wherein the first surface has a first region and a second region;
two electrodes disposed on the first region of the first surface of the light emitting diode chip, and not disposed on the second region of the first surface of the light emitting diode chip;
a phosphor layer having a plurality of phosphors, wherein the plurality of phosphors are directly disposed on the second surface of the light emitting diode chip;
a protection layer disposed on the phosphor layer;
a $Si_3N_4$ film disposed on the protection layer; and
a light filtering layer disposed on the protection layer, wherein the light filtering layer is a dual-band notch filtering layer or a triple-mode bandpass filtering layer.

12. The display device of claim 11, wherein the light emitting diode chip further comprises a side surface connecting to the first surface and the second surface, and the phosphor layer is further disposed on the side surface.

13. The display device of claim 12, wherein the light filtering layer is further disposed on a surface of the phosphor layer corresponding to the side surface.

14. The display device of claim 12, wherein the protection layer is disposed on surfaces of the phosphor layer corresponding to the second surface and the side surface.

15. The display device of claim 13, wherein the protection layer is disposed on surfaces of the phosphor layer corresponding to the second surface and the side surface.

* * * * *